USOO6788058B1

(12) United States Patent
Petropoulos et al.

(10) Patent No.: US 6,788,058 B1
(45) Date of Patent: Sep. 7, 2004

(54) ASYMMETRIC RING DOME RADIO FREQUENCY COIL

(75) Inventors: Labros S. Petropoulos, Solon, OH (US); Joseph Murphy-Boesch, Aurora, OH (US); Keith Richmond, Garrettsville, OH (US)

(73) Assignee: General Electric Company, Schenectady, NY (US)

( * ) Notice: Subject to any disclaimer, the term of this patent is extended or adjusted under 35 U.S.C. 154(b) by 117 days.

(21) Appl. No.: 10/094,378

(22) Filed: Mar. 8, 2002

Related U.S. Application Data (60) Provisional application No. 60/270,660, filed on Mar. 8, 2001.

(51) Int. Cl.[7] .................................................. G01V 3/00
(52) U.S. Cl. ...................................................... 324/318
(58) Field of Search ................................ 324/300–309, 324/318, 322; 600/410

(56) References Cited

U.S. PATENT DOCUMENTS

| 4,680,548 | A | | 7/1987 | Edelstein et al. |
| 4,692,705 | A | | 9/1987 | Hayes |
| 4,694,255 | A | | 9/1987 | Hayes |
| 4,837,515 | A | * | 6/1989 | Nishihara et al. ........... 324/318 |
| 5,003,265 | A | * | 3/1991 | Leussler ...................... 324/318 |
| 5,050,605 | A | * | 9/1991 | Eydelman et al. .......... 600/422 |
| 5,144,240 | A | * | 9/1992 | Mehdizadeh et al. ....... 324/318 |
| 5,194,811 | A | | 3/1993 | Murphy-Boesch et al. |
| 5,202,635 | A | | 4/1993 | Srinivasan et al. |
| 5,212,450 | A | | 5/1993 | Murphy-Boesch et al. |
| 5,315,251 | A | | 5/1994 | Derby |
| 5,515,855 | A | | 5/1996 | Meyer et al. |
| 5,565,780 | A | * | 10/1996 | Derby ......................... 324/322 |
| 5,602,479 | A | | 2/1997 | Srinivasan et al. |
| 5,682,893 | A | * | 11/1997 | Meyer et al. ................ 600/421 |
| 5,986,454 | A | | 11/1999 | Leifer |
| 6,043,658 | A | * | 3/2000 | Leussler ...................... 324/318 |
| 6,100,691 | A | * | 8/2000 | Yeung ......................... 324/318 |
| 6,313,633 | B1 | * | 11/2001 | Boskamp ..................... 324/319 |
| 6,344,745 | B1 | * | 2/2002 | Reisker et al. .............. 324/318 |
| 6,452,393 | B1 | * | 9/2002 | Allen et al. ................. 324/318 |

OTHER PUBLICATIONS

Cecil E. Hayes, et al., "An Efficient, Highly Homogeneous Radiofrequency Coil for Whole–Body NMR Imaging at 1.5 T", Journal of Magnetic Resonance 63, 1985, pp. 622–628.
Joseph Murphy–Boesch, et al., "Two Configurations of the Four–Ring Birdcage Coil for $^1$H Imaging and $^1$H–Decoupled $^{31}$P Spectroscopy of the Human Head", Journal of Magnetic Resonance, Series B 103, 1994, pp. 103–114.

* cited by examiner

Primary Examiner—Diego Gutierrez
Assistant Examiner—Dixomara Vargas
(74) Attorney, Agent, or Firm—Michael A. Della Penna; Armstrong Teasdale LLP (57) ABSTRACT

A MRI coil having an axis and a first end and an opposite second end with respect to said axis includes a first ring element at the first end, a second ring element, a third ring element, a fourth ring element at the second end where the first ring element encompasses a smaller area than each of the second, third, and fourth ring elements. The coil also includes a plurality of axial elements connected between the first, second, third and fourth ring elements. The third and fourth ring elements are axially closer than the first and second ring elements.

20 Claims, 10 Drawing Sheets

Band Pass

Figure 1

High Pass

CO-ROTATING MODE

Low Pass

Fig. 7

Band Pass

Fig. 8

Modified Low Pass

Fig. 9

Modified Band Pass

Fig. 10

ASYMMETRIC RING DOME RADIO FREQUENCY COIL

CROSS-REFERENCE TO RELATED APPLICATION

This application claims the benefit of U.S. provisional patent application Ser. No. 60/270,660 filed Mar. 8, 2001.

BACKGROUND OF THE INVENTION

The present invention relates to magnetic resonance imaging and, in particular, to a dome-like radio frequency coil.

Radio frequency (RF) coils are used to excite and/or sense magnetic resonance (MR) signals for magnetic resonance imaging (MRI).

Birdcage resonators are a commonly used form of volume RF coil. A birdcage coil is typically cylindrically shaped with a ring element at each end connected with multiple axial elements. Ellipse-like and other shapes have also been used for the rings. Good radial RF field uniformity is achieved, but towards the ends of the cylinder, the RF field in the axial direction drops off substantially (e.g., 50 percent).

Improvements in uniformity of the RF field in the axial direction can be achieved by lengthening the coil. Unfortunately, this may be impractical for various reasons, including: the necessary space may not be available, particularly in the case of a head coil where the patient's shoulders are in the way; or a larger coil may require too much power to be coupled into the patient.

Improved axial uniformity has also been produced by symmetrically locating a second ring near to each of the end rings. This structure does not however take advantage of the signal to noise ratio (SNR) improvements that may be achieved by having the coil conform better to the patient, for example, by getting close to the top of a patient's head in a head coil.

Improved axial uniformity has also been achieved at one end of the coil by creating a dome-like structure by joining the axial elements together at that end instead of terminating them on an end ring. The dome may, for example, follow the general shape of a patient's head and increase the RF field as the dome narrows, helping to compensate for the axial drop off in field that would occur otherwise. Unfortunately this can only improve the performance of one end of the coil. In addition, this convergence to a single point generates a very intense RF "hot spot". This hot spot can over rotate the local nuclei spins, resulting in the presence of "black" spots in the resulting image.

SUMMARY OF THE INVENTION

A MRI coil having an axis and a first end and an opposite second end with respect to said axis includes a first ring element at the first end, a second ring element, a third ring element, a fourth ring element at the second end where the first ring element encompasses a smaller area than each of the second, third, and fourth ring elements. The coil also includes a plurality of axial elements connected between the first, second, third and fourth ring elements. The third and fourth ring elements are axially closer than the first and second ring elements.

DESCRIPTION OF THE PREFERRED EMBODIMENTS

Figure 1:
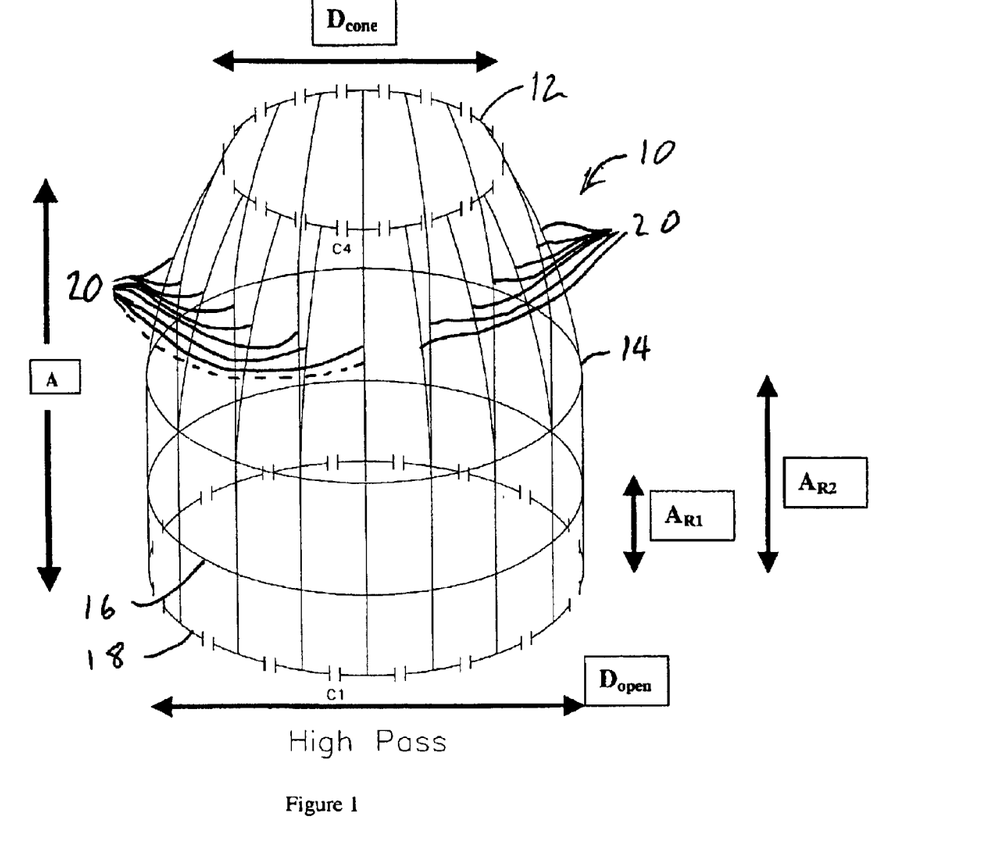
FIG. 1 is a perspective view schematic diagram of a coil according to the present invention.

Referring to FIG. 1, a MRI coil 10 includes a first ring element 12, a second ring element 14, a third ring element 16 and a fourth ring element 18. The elements 14, 16 and 18 have a diameter $D_{open}$. The element 12 has a diameter $D_{cone}$ that is less than $D_{open}$. The coil 10 has an axial length A. The element 16 is spaced a distance $A_{R1}$ from the element 18 and the element 14 is spaced a distance $A_{R2}$ from the element 18. The element 16 and the element 18 are axially closer than the element 12 is to the element 14. For example, $D_{open}$ may be 267 mm, $D_{cone}$ may be 180 mm, A may be 245 mm, $A_{R1}$ may be 50 mm, and $A_{R2}$ may be 120 mm.

Axial elements 20 connect the ring elements 12, 14, 16, 18. The elements 20 radially curve from the element 14 to the element 12 to provide a dome-like shape to the coil 10. There may be, for example, sixteen elements 20. The elements 20 are largely responsible for transverse RF field uniformity.

The coil 10 has capacitances (e.g., C1 and C4) in the ring elements 12, 18 and no capacitances in the axial elements 20. The coil 10 is a tuned circuit resonator which is in a high pass configuration. The capacitances are chosen to provide resonance at the desired frequency (e.g., 127.7 MHz).

Figure 2:
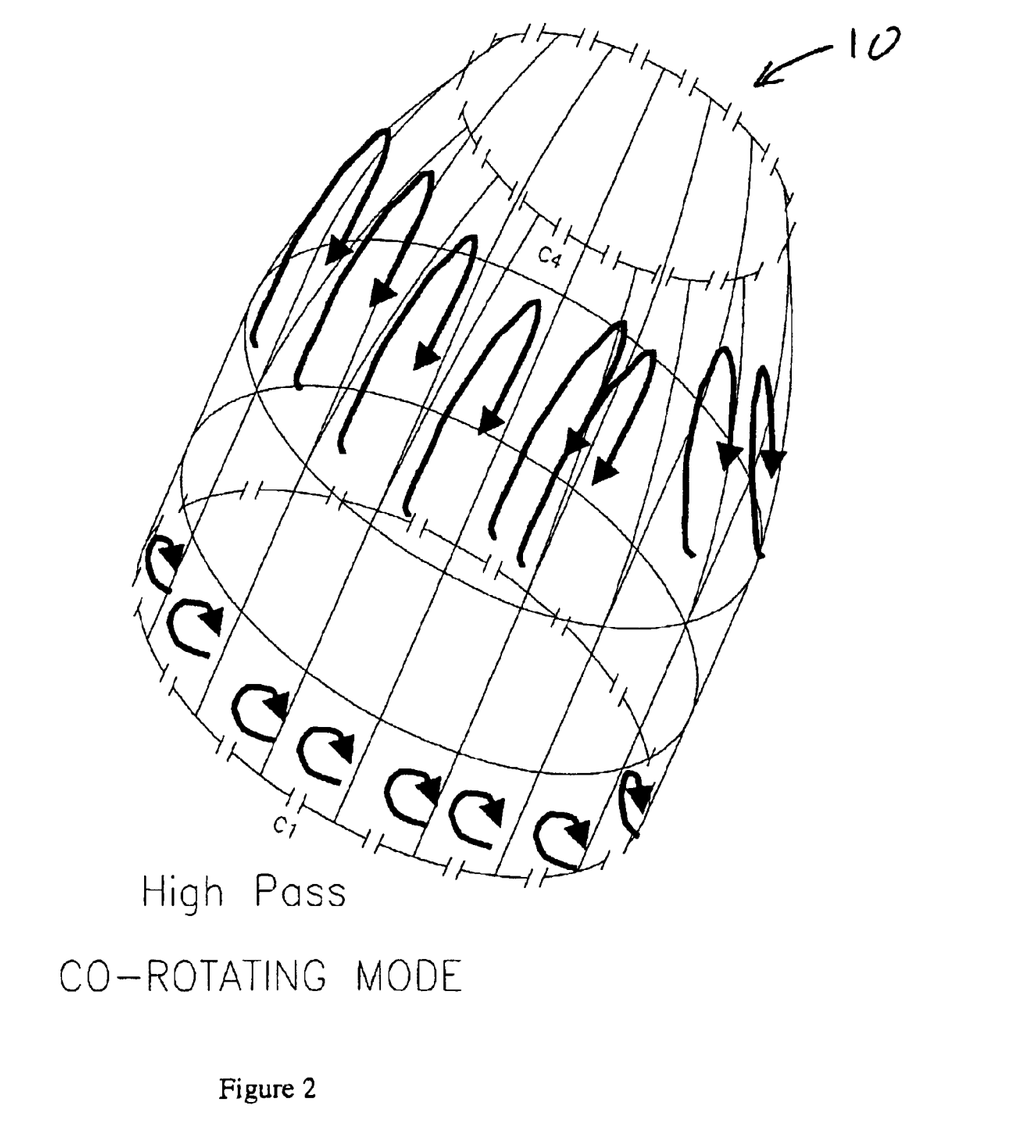
FIG. 2 is a perspective view schematic diagram of the coil of FIG. 1 illustrating one mode of operation.
Figure 3:
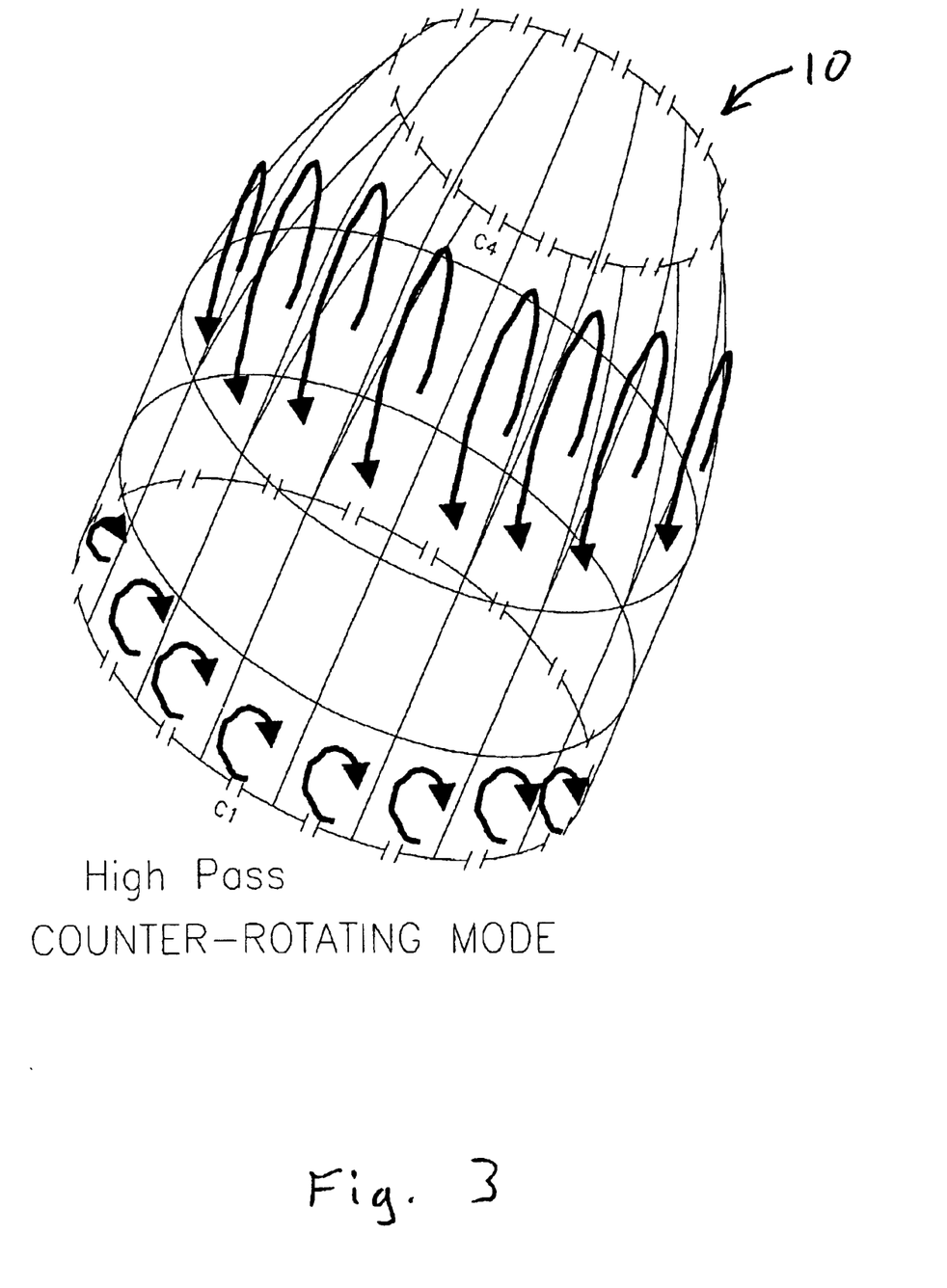
FIG. 3 is a perspective view schematic diagram of the coil of FIG. 1 illustrating another mode of operation.

The coil 10 can support the modes shown in FIGS. 2 and 3. FIG. 2 shows a co-rotating mode for the currents in the coil 10. FIG. 3 shows a counter-rotating mode for the currents in the coil 10. For producing a uniform field at the element 18 end of the coil 10, the co-rotating mode is used.

Figure 4:
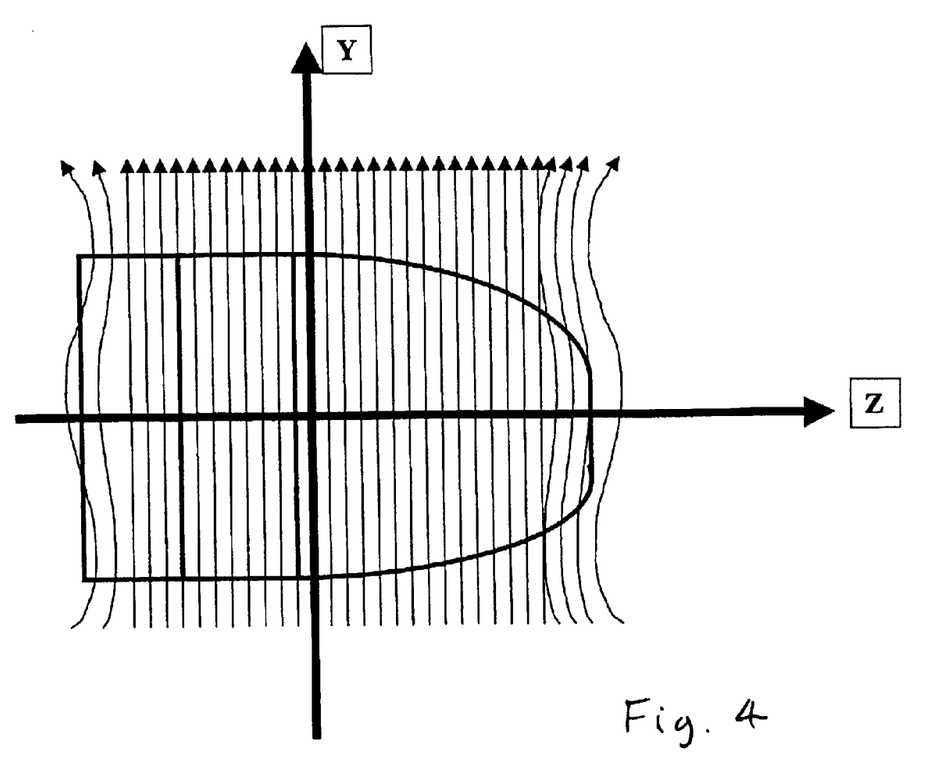
FIG. 4 is a graphically representation of the flux lines corresponding to FIG. 2.
Figure 6:
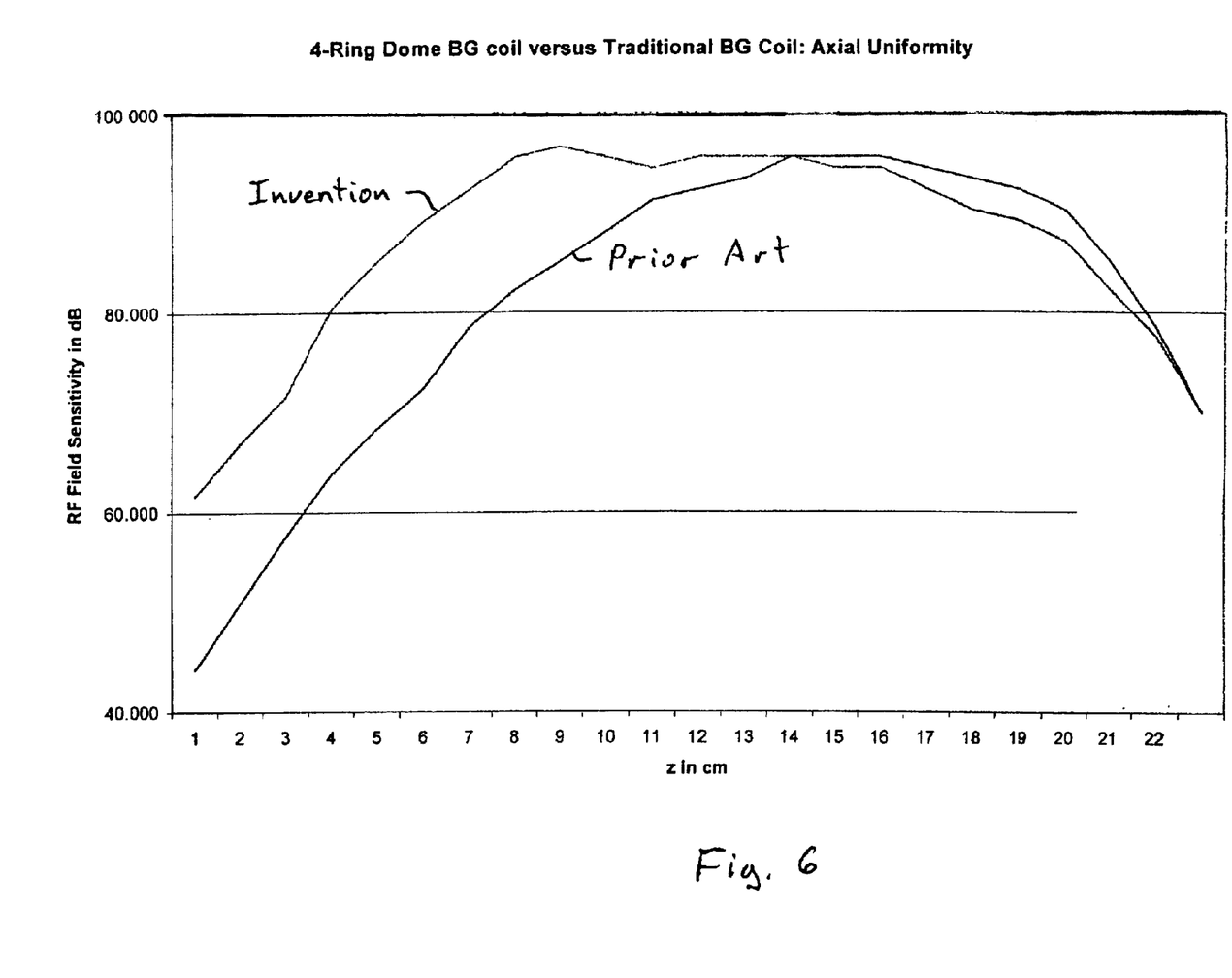
FIG. 6 is an exemplary graph of the axial field uniformity of a coil according to the invention and an exemplary graph of the axial field uniformity of a prior art dome coil.

FIG. 4 illustrates the very uniform flux lines produced in the coil 10. FIG. 6 illustrates a comparison of the axial RF uniformity of the coil 10 compared to a prior art dome coil without a ring element 12 at the top of the dome and without asymmetrically located intermediate ring elements 14, 16. The open end of the coils are at the origin. It is clear that the coil 10 provides as much as 25 percent improvement over the prior art coil.

The coil 10 can be used as a transmit, receive or transceiver coil. The ring element 12 provides for the adjustment of the RF field in that area to correspond to that of the center of the coil without "hot spots" that degrade the resulting images. The two asymmetrically located ring element 14, 16 operate to enhance the uniformity of the open end of the coil in the area of the ring element 18.

In addition to being circular, just as in prior art coils, the ring elements of the coil 10 can be ellipse-like or other non-circular shapes appropriate for minimizing the distance between the coil and the subject to be imaged. In some cases, it may also be desirable to have differing numbers of the axial elements 20 between the ring elements 12, 14, 16 and 18. For example, sixteen elements 20 between the ring elements 14, 16 and twelve elements 20 between the ring elements 12, 14.

The coil 10 may be mounted in any appropriate manner. For example, the coil 10 may be within plastic or foam in such configurations as clamshell, split-top, solid configuration or split into more than two pieces.

Figure 5:
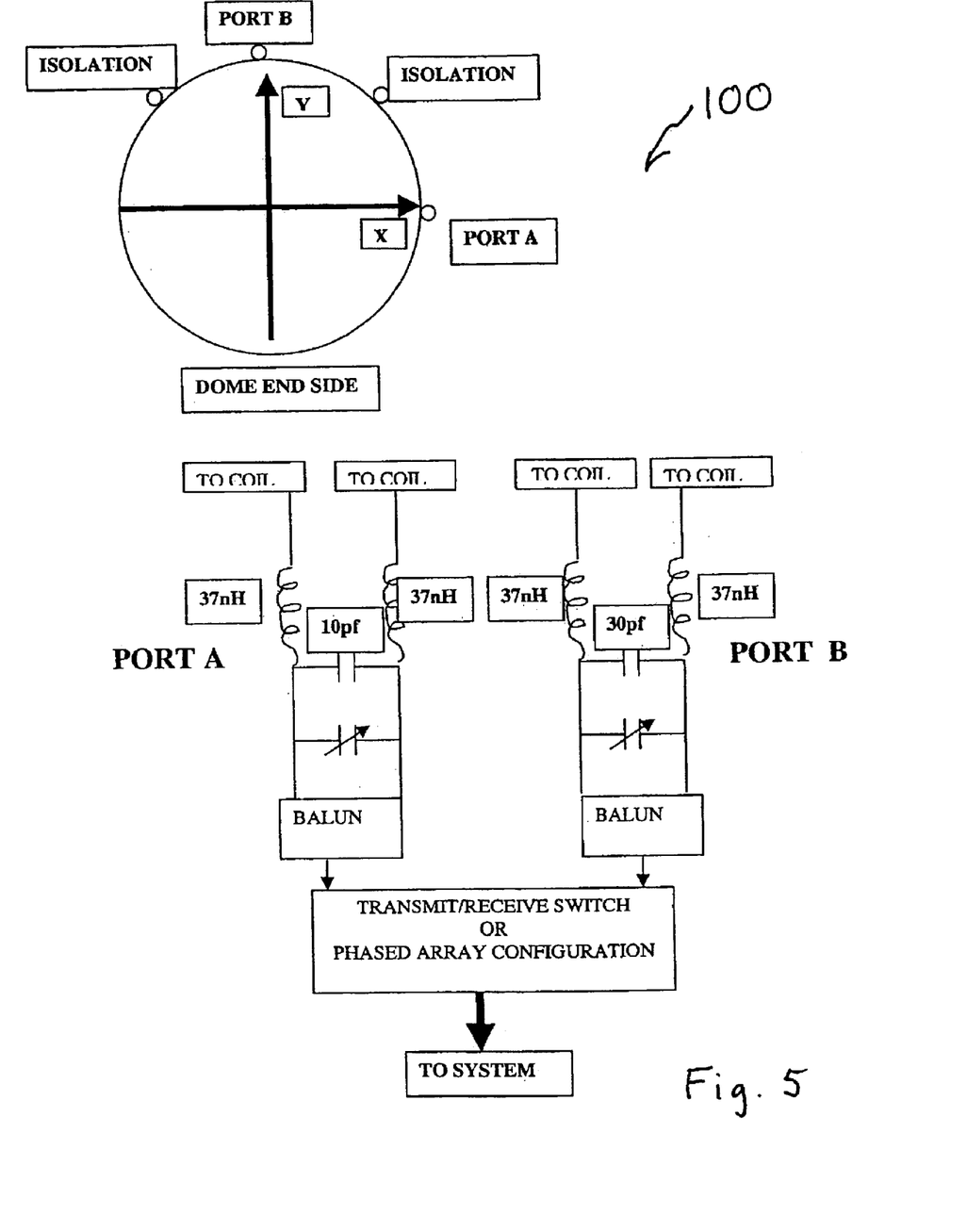
FIG. 5 is a block diagram of one configuration for operating a coil according to the present invention.

Referring to FIG. 5, a possible coupling circuit 100 for coupling the coil 10 to a MR scanner system is illustrated. The coil is matched to the load via tuning points and associated isolation points utilizing inductive matching. Capacitive matching on the coil's feed ports can also be used. The feeding coil ports of the coil can be located, for example, at the dome end of the coil, the patient end of the coil, or along the legs of the coil or any combination of these locations. In addition, inductive matching techniques can be utilized to drive both ports of the coil in a quadrature fashion. In the case that a linear coil is desired, the matching of the coil can be done with one port. In FIG. 5 a balun is used after the matching network of the coil. It would also be possible to use other configurations, or perhaps a balun could be used at a cable location further removed from the coil. The coil can also be driven in a transmit/receive configuration. In this case a hybrid network can be used. When the coil is used in a phased array configuration, the hybrid network may be omitted. Also pre-amplifiers can be located in the coil design in order to eliminate cable and/or system losses.

Figure 7:
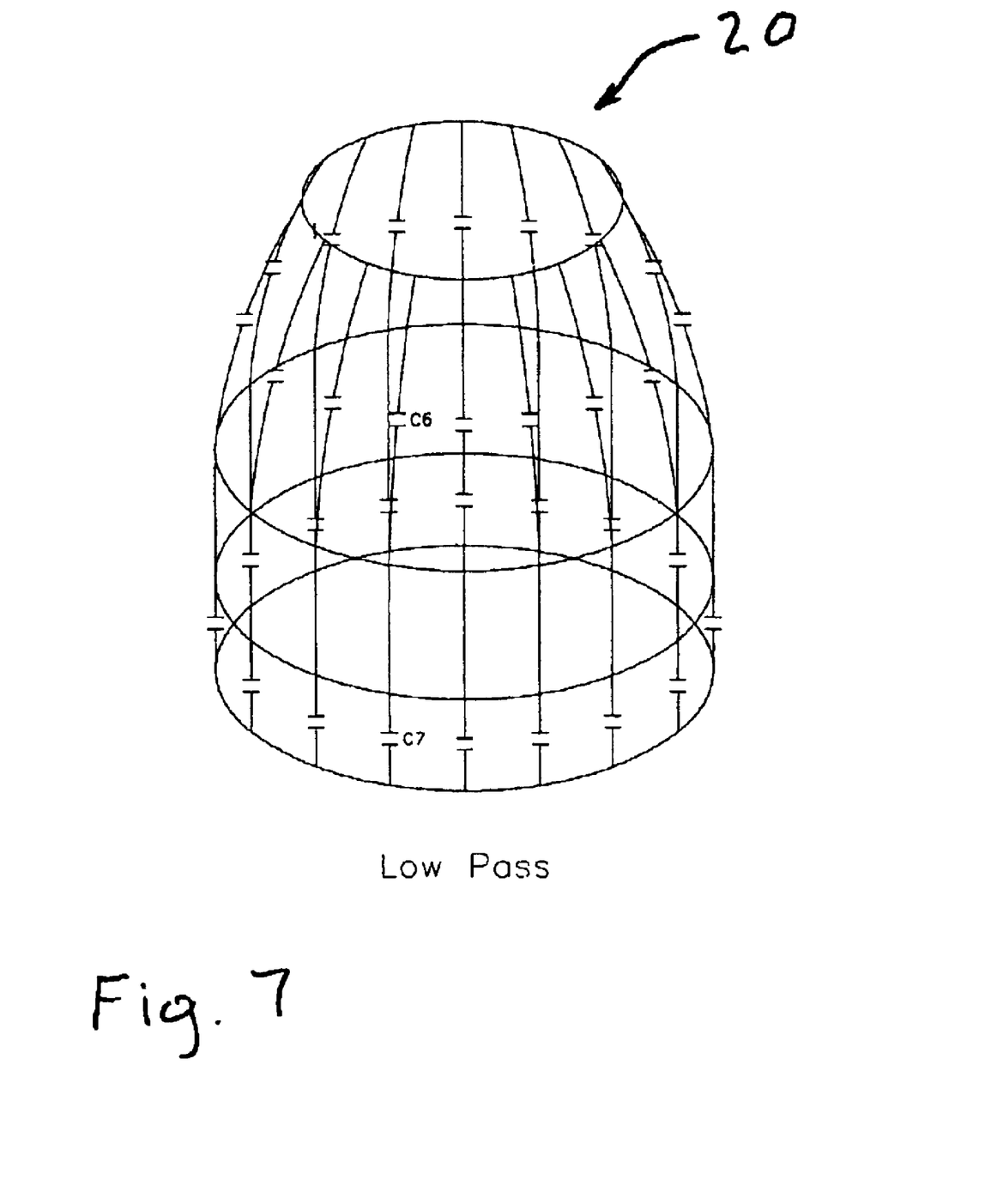
FIG. 7 is a perspective view schematic diagram of another coil according to the present invention.

Referring to FIG. 7, a coil 20 similar to the coil 10 is illustrated. The coil 20 has capacitors C6, C7 in the axial elements instead of capacitors in the ring elements. The coil 20 is a tuned circuit resonator which is in a low pass configuration. The capacitances are chosen to provide resonance at the desired frequency (e.g., 127.7 MHz).

Figure 8:
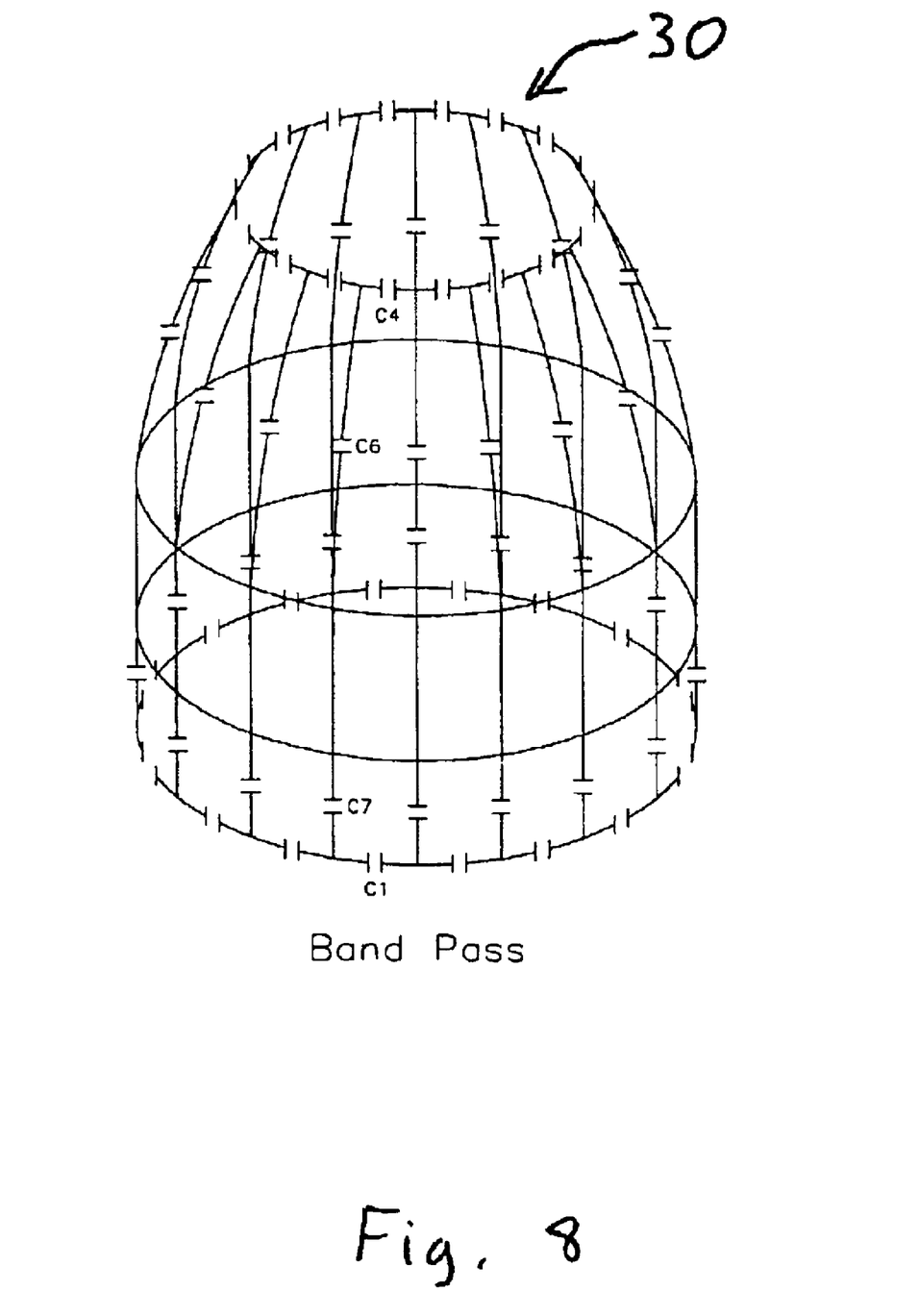
FIG. 8 is a perspective view schematic diagram of still is another coil according to the present invention.

Referring to FIG. 8, a coil 30 similar to the coil 10 is illustrated. The coil 30 has capacitors C6, C7 in the axial elements in addition to the capacitors C1, C4 in the end ring elements. The coil 20 is a tuned circuit resonator which is in a band pass configuration. The capacitances are chosen to provide resonance at the desired frequency (e.g., 127.7 MHz).

Figure 9:
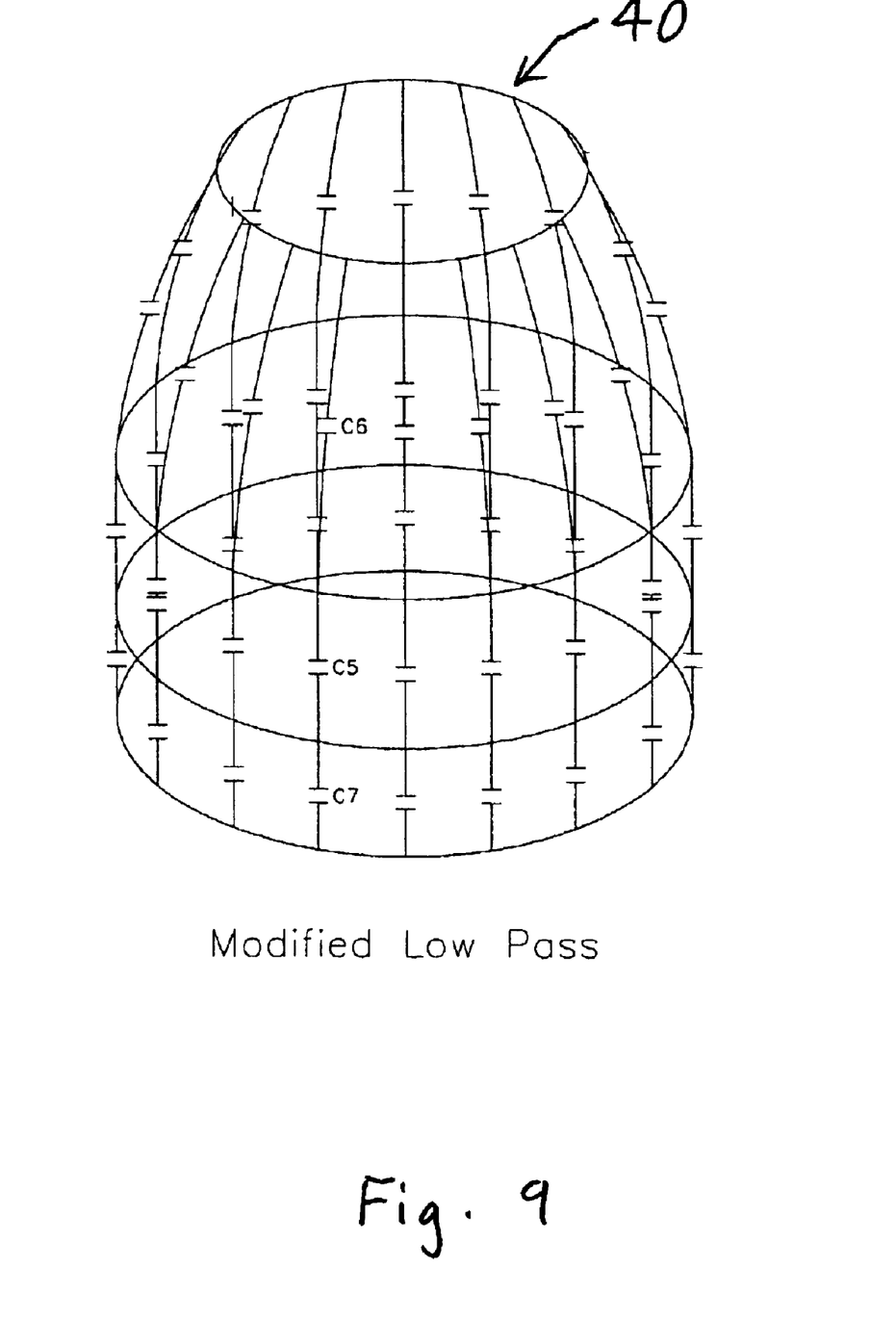
FIG. 9 is a perspective view schematic diagram of an additional coil according to the present invention.

Referring to FIG. 9, a coil 40 similar to the coil 20 is illustrated. The coil 40 has capacitors C6, C7 plus capacitors C5 in the axial elements. The coil 40 is a tuned circuit resonator which is in a modified low pass configuration, that may be tuned to dual resonant frequencies.

Figure 10:
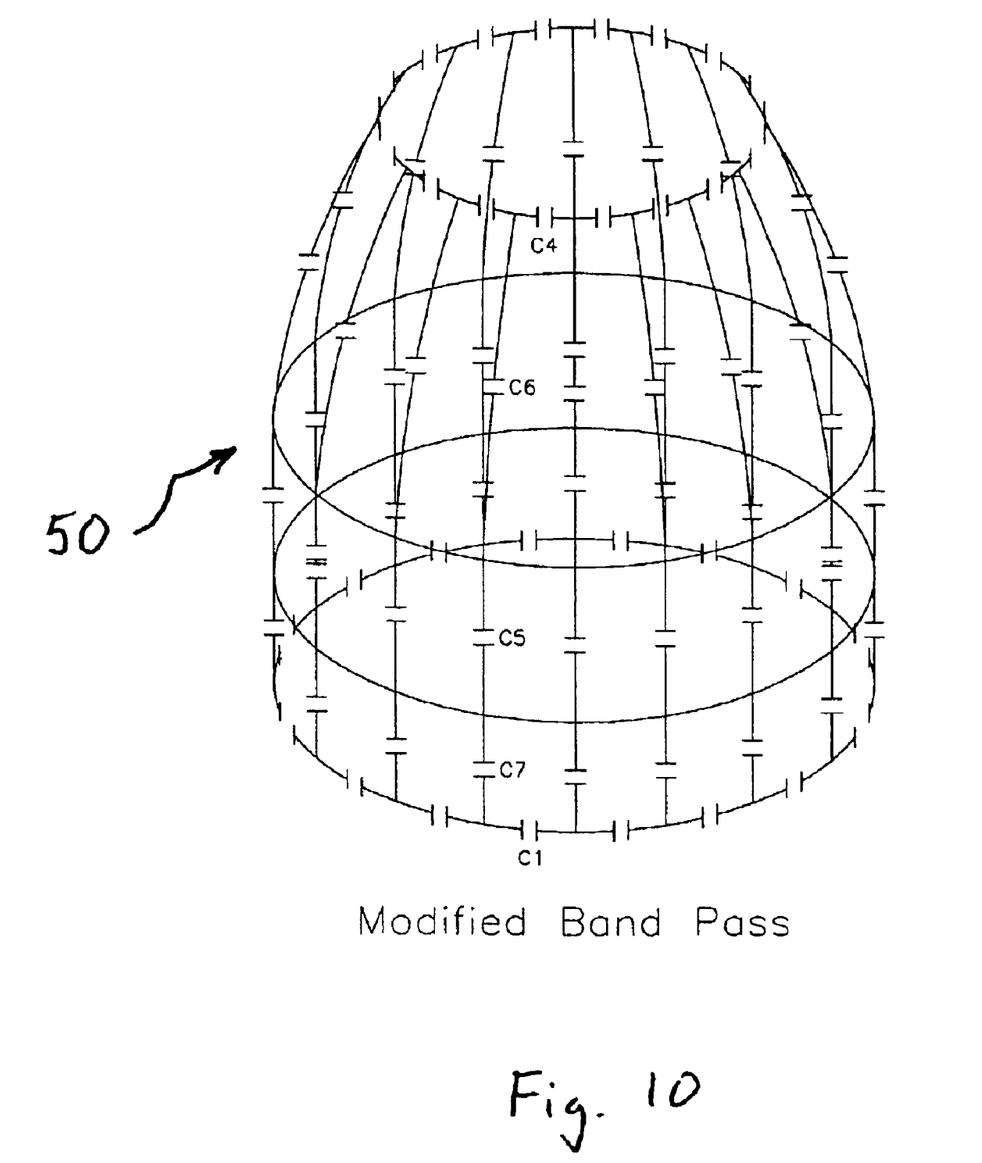
FIG. 10 is a perspective view schematic diagram of another additional coil according to the present invention.

Referring to FIG. 10, a coil 50 similar to the coil 40 is illustrated. The coil 50 has the capacitors C5, C6, C7 in the axial elements and the capacitors C1, C4 in the end ring elements. The coil 50 is a tuned circuit resonator which is in a modified band pass configuration, that may be tuned to dual resonant frequencies.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A MRI coil having an axis and a first end and an opposite second end with respect to said axis, said coil comprising:

a first ring element at said first end;

a second ring element adjacent said first ring element;

a third ring element adjacent said second ring element;

a fourth ring element at said second end and adjacent said third ring element, said first ring element encompassing a smaller area than each of said second, third, and fourth ring elements; and a plurality of axial elements connected between said first, second, third and fourth ring elements, wherein said third and fourth ring elements are axially closer than said first and second ring elements.

2. A MRI coil according to claim 1, wherein said ring elements are circular.

3. A MRI coil according to claim 1, wherein said ring elements are ellipse-like.

4. A MRI coil according to claim 1, wherein said ring elements are non-circular.

5. A MRI coil according to claim 1, having a high pass configuration.

6. A MRI coil according to claim 1, having a low pass configuration.

7. A MRI coil according to claim 1, having a band pass configuration.

8. A MRI coil according to claim 1, having a dual frequency configuration.

9. A MRI coil according to claim 1, wherein said plurality of axial elements radially curve from form said second ring element to said first ring element.

10. A MRI coil according to claim 1, wherein said second, third and fourth ring elements are configured to form a generally cylindrical arrangement.

11. A MRI coil according to claim 1, wherein said second and third ring elements are configured in an asymmetrical arrangement.

12. A MRI coil according to claim 1, wherein said ring elements are configured in one of a clamshell, split-top, solid and multi-piece configuration.

13. A MRI coil comprising: a first ring element at a first end; a second ring element at a second end, said first end opposite said second end with respect to an axis; a plurality of intermediate ring elements positioned asymmetrically between said first and second ring elements wherein said first ring element encompassing a smaller area than each of said second ring and said plurality of intermediate ring elements; and a plurality of axial elements connected between said first, second and plurality of intermediate ring elements.

14. A MRI coil according to claim 13, wherein the axis comprises a longitudinally extending axis.

15. A MRI coil according to claim 13, wherein said intermediate ring elements comprise third and fourth ring elements and said third and fourth ring elements are axially closer than said first and second ring elements.

16. A MRI coil according to claim 13, wherein said ring elements are configured in a successive arrangement.

17. A MRI coil according to claim 13, further comprising a plurality of capacitors in at least one of (i) the ring elements and (ii) the plurality of axial elements.

18. A MRI coil according to claim 13, further comprising a plurality of capacitors in one of the ring elements and one of the plurality of axial elements.

19. A method of magnetic resonance imaging, said method comprising: configuring a coil arrangement to include a plurality of intermediate ring elements positioned asymmetrically between a first and second ring elements, said first and second ring elements at opposite ends of said coil arrangement wherein said first ring element encompassing a smaller area than each of said second ring and said plurality of intermediate ring elements.

20. A method according to claim 19, further comprising tuning said coil arrangement using a plurality of capacitors in at least one of the ring elements.

* * * * *